(12) United States Patent
Atlas

(10) Patent No.: US 7,112,874 B2
(45) Date of Patent: Sep. 26, 2006

(54) FORMING A MULTI SEGMENT INTEGRATED CIRCUIT WITH ISOLATED SUBSTRATES

(75) Inventor: Eugene Atlas, Irvine, CA (US)

(73) Assignee: ImagerLabs, Inc., Irvine, CA (US)

( * ) Notice: Subject to any disclaimer, the term of this patent is extended or adjusted under 35 U.S.C. 154(b) by 357 days.

(21) Appl. No.: 10/442,542

(22) Filed: May 20, 2003

(65) Prior Publication Data

US 2003/0216010 A1    Nov. 20, 2003

Related U.S. Application Data

(60) Provisional application No. 60/382,682, filed on May 20, 2002.

(51) Int. Cl.
    *H01L 23/02*    (2006.01)
(52) U.S. Cl. .................................................... 257/678
(58) Field of Classification Search ................ 438/107, 438/15; 257/713, 700, 666, 562, 703, 702, 257/678; 73/204.22
    See application file for complete search history.

(56) References Cited

U.S. PATENT DOCUMENTS

| | | | |
|---|---|---|---|
| 4,484,215 A * | 11/1984 | Pappas | 257/713 |
| 4,695,870 A * | 9/1987 | Patraw | 257/700 |
| 5,151,776 A | 9/1992 | Wojnarowski et al. | |
| 5,519,353 A | 5/1996 | Rainal | |
| 5,674,785 A | 10/1997 | Akram et al. | |
| 6,102,963 A | 8/2000 | Agrawal | |
| 6,208,018 B1 | 3/2001 | Ma et al. | |
| 6,452,265 B1 | 9/2002 | Furukawa et al. | |
| 6,672,154 B1 * | 1/2004 | Yamagishi et al. | 73/204.22 |
| 2003/0042567 A1 | 3/2003 | Tilmans et al. | |

\* cited by examiner

*Primary Examiner*—Carl Whitehead, Jr.
*Assistant Examiner*—Monica D. Harrison
(74) *Attorney, Agent, or Firm*—MacPherson Kwok Chen & Heid LLP; Tom Chen

(57) ABSTRACT

Methods of forming a multi-segment chip or integrated circuit device are provided. The multi-segment chip may comprise at least two blocks, such as an analog integrated circuit block and a digital integrated circuit block, with substrates that are isolated from each other. Thus, each block may have independent operation voltage or other characteristics.

35 Claims, 9 Drawing Sheets

FIG. 1B

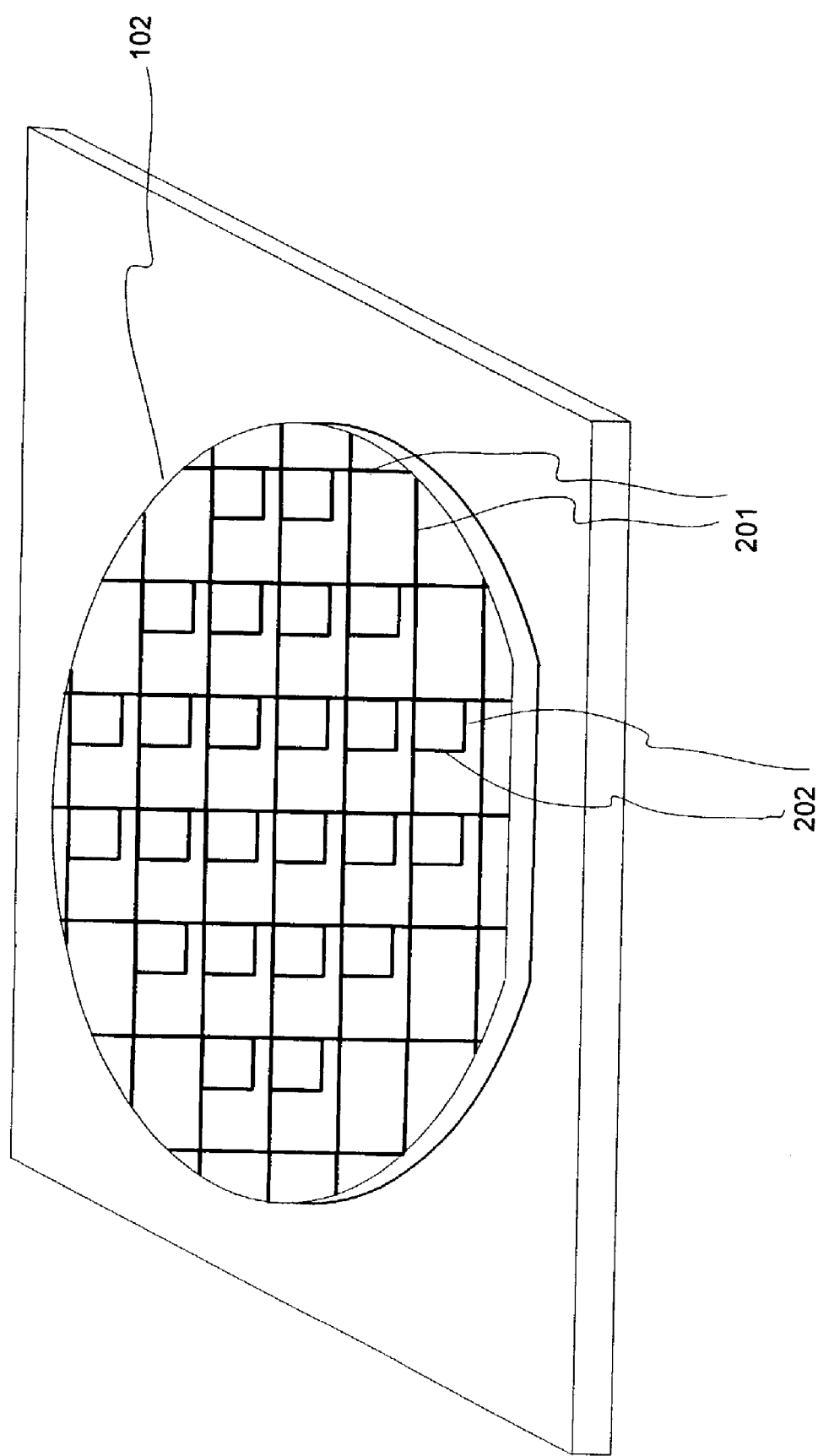

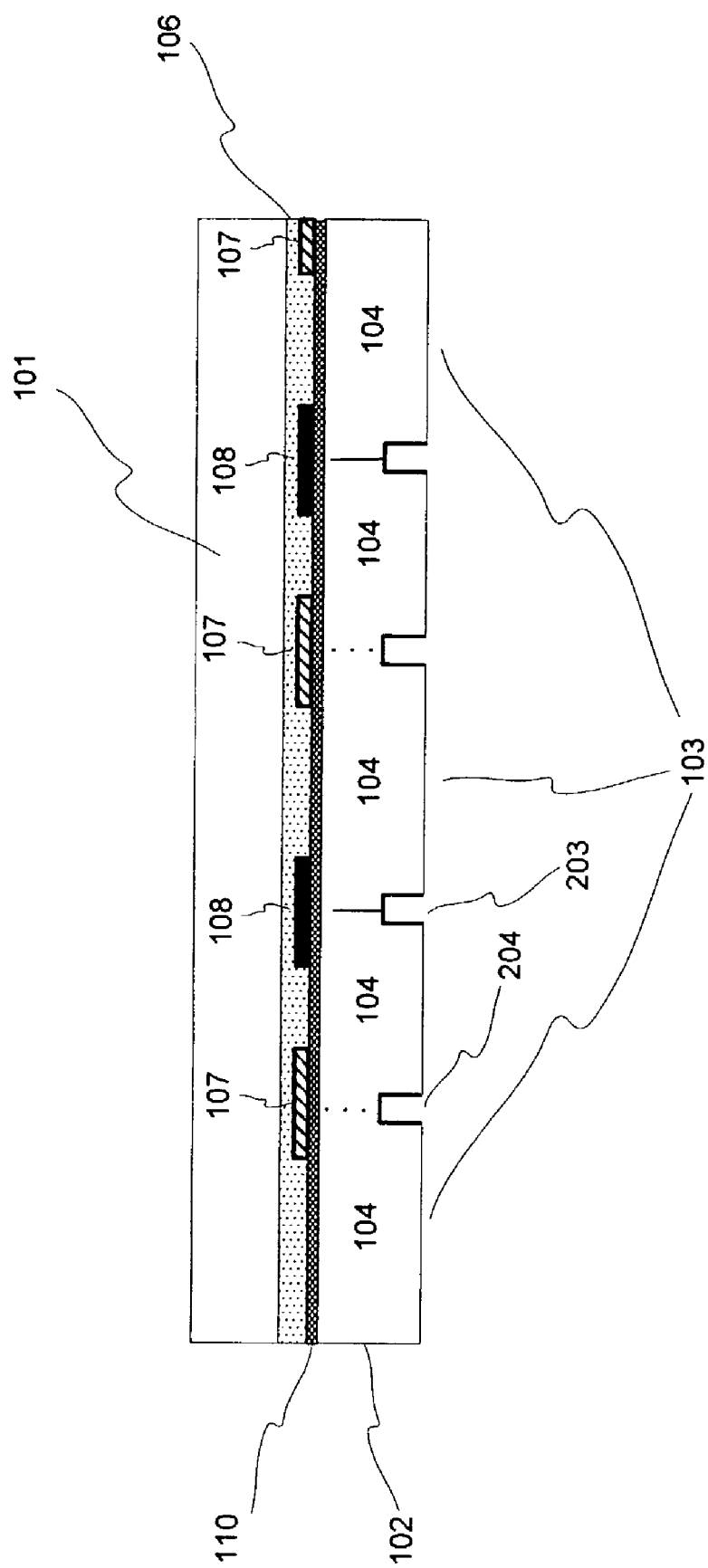

```
┌─────────────────────────────────────────────────────────────┐
│ FORMING FIRST AND SECOND INTERCONNECTS ON A FIRST PLANAR    │
│ SURFACE OF A SUBSTRATE, THE SUBSTRATE COMPRISING FIRST      │
│ AND SECOND INTEGRATED CIRCUIT DIES, THE FIRST INTEGRATED    │
│ CIRCUIT DIE COMPRISING FIRST AND SECOND SUB-DIES, THE FIRST │─── 700
│ INTERCONNECT OVERLAYING THE FIRST AND SECOND SUB-DIES,      │
│ THE SECOND INTERCONNECT OVERLAYING THE FIRST AND SECOND     │
│ INTEGRATED CIRCUIT DIES                                     │
└─────────────────────────────────────────────────────────────┘
                              ↓
┌─────────────────────────────────────────────────────────────┐
│ ATTACHING A FIRST INSULATING LAYER TO THE FIRST PLANAR      │─── 702
│ SURFACE OF THE SUBSTRATE                                    │
└─────────────────────────────────────────────────────────────┘
                              ↓
┌─────────────────────────────────────────────────────────────┐
│ SCRIBING A SECOND PLANAR SURFACE OF THE SUBSTRATE TO        │
│ FORM (A) A SCRIBED CHANNEL BETWEEN THE FIRST AND SECOND     │─── 704
│ INTEGRATED CIRCUIT DIES AND (B) AN ISOLATION CHANNEL        │
│ BETWEEN THE FIRST AND SECOND SUB-DIES                       │
└─────────────────────────────────────────────────────────────┘
                              ↓
┌─────────────────────────────────────────────────────────────┐
│ ETCHING THE SCRIBED CHANNEL AND THE ISOLATION CHANNEL       │─── 706
└─────────────────────────────────────────────────────────────┘
                              ↓
┌─────────────────────────────────────────────────────────────┐
│ ATTACHING A SECOND INSULATING LAYER TO THE SECOND           │─── 708
│ PLANAR SURFACE OF THE SUBSTRATE                             │
└─────────────────────────────────────────────────────────────┘

┌─────────────────────────────────────────────────────────────┐
│        ADDITIONAL STEPS OF CUTTING AND SEPARATING THE DIES  │
│                                                             │
│                                                             │─── 710
└─────────────────────────────────────────────────────────────┘
```

FIG. 7

FORMING A MULTI SEGMENT INTEGRATED CIRCUIT WITH ISOLATED SUBSTRATES

The present application claims priority to U.S. Provisional Patent Application No. 60/382,682, filed 5/20/02 which is hereby incorporated by reference in its entirety.

BACKGROUND

Many state-of-the-art chips are expected to perform complicated tasks, which may require portions of an integrated circuit device to have different electrical characteristics. These different portions of the integrated circuit device may be referred to as "sub-circuits," which may require contradictory electrical characteristics, such as high voltage versus low voltage, analog (high precision) versus digital logic and/or mixed signal, low frequency versus high frequency, high immunity to noise versus relative insensitivity to noise, parasitic crosstalk and so on. A major challenge in forming integrated circuit devices is trying to combine various sub-circuits within one integrated circuit device without compromising quality of signal, functionality, size and cost.

At present, there are several methods that attempt to solve this major challenge. None of these methods are fully successful or cost effective. These methods can be generally categorized into two groups: "multi-die" solutions and "on-chip" solutions.

For "multi-die" solutions, there are presently two methods called "multi-chip-module" and "multi-package." "Multi-chip-module" employs packaging several separate but functionally related dies, i.e., chips, into a single electrical package. The separate dies within the single electrical package are electrically connected in order to perform the combined task. This method may suffer from several serious drawbacks and may not completely answer cost, size and other challenges. This method may have a high fabrication cost due to the multiplicity of dies and a larger package, and it may increase package complexity (e.g., complicate design of each die). It may compromise performance quality since signals need to be driven across wire bonds pads versus submicron on-chip interconnects, and thus increase power dissipation, noise and reduce speed.

"Multi-package" employs packaging several separate but functionally related dies i.e.,—chips, each into separate electronic packages. All packages then must be mounted and connected on a printed circuit board (PCB) in order to perform the combined task. This method may also suffer from several serious drawbacks. First, like the "multi-die" method, the multi-package method may increase total cost of the solution and complexity. The method may degrade quality of performance even more since driving PCB wires in addition to the wire bonds pads impedes speed further and increases power dissipation and noise.

For "on-chip" solutions, there are presently two methods called "on-chip-compensation" and "grounding-and-isolation-network." Compensation circuitry employs various specially designed electronic circuits that do not perform part of the intended task but rather attempt to compensate for the problems that occur as a result of the existence of mixed electrical characteristics on a single die. This method may suffer from serious drawbacks. The method may significantly increase design complexity and hence design cost. The method may also increase development risk due to additional new sub-circuits, and to present additional sub-circuits is only a partial solution at best.

Extensive "grounding-and-isolation-network" employs additional ground planes and power buses beyond those required for performing the task itself. This method may also suffer from serious drawbacks. It may increase die area and number of pads, and may increase package size, all of which increases total cost. The method may add additional design complexity to the chip and may increase the complexity of the external circuitry that is required to rout and supply the extra ground and power lines. This method may be only a partial solution that suffers from parasitic substrate coupling and compromises quality of performance.

SUMMARY

The present application relates to a method and system of forming a multi-segment chip or integrated circuit device. The multi-segment chip comprises two or more segments (also referred to as integrated circuit blocks or sub-dies), such as an analog integrated circuit segment, a digital integrated circuit segment, and a mixed signal integrated circuit segment, with substrates that are physically isolated from each other. Each segment may have, for example but not limited to, an independent voltage (analog, mixed signal or digital; high voltage or low voltage), current, power (high power or low power), frequency (high frequency or low frequency), speed, noise immunity (e.g., low noise) or any other functional, electrical or physical characteristic that would benefit from isolation from another segment or circuit block. Each segment with its own substrate may be free from interference from other segments.

The methods described here may provide a number of advantages. The methods, and an integrated circuit device produced by the methods, may overcome many of the limitations described above. The methods may provide integrated circuits of mixed electrical characteristic with significantly enhanced performance without notably compromising die size, number of electrical packages, total cost or complexity of either design or production. The integrated circuits may reduce or minimize undesirable substrate coupling.

One aspect of the application relates to a method of forming a multi-segment chip. The method comprises forming first and second connects on a first planar surface of a substrate, the substrate comprising first and second integrated circuit dies, the first integrated circuit die comprising at least first and second sub-dies, the first connect interconnecting the first and second sub-dies, the second connect (or pads) at least partially overlaying the first and second integrated circuit dies; attaching a first insulating layer to the first planar surface of the substrate; scribing a second planar surface of the substrate to form (a) a scribed channel between the first and second integrated circuit dies and (b) an isolation channel between the first and second sub-dies; etching the scribed channel and the isolation channel; and attaching a second insulating layer to the second planar surface of the substrate.

The details of one or more aspects are set forth in the accompanying drawings and the description below. Other features and advantages will be apparent from the description and drawings, and from the claims.

DESCRIPTION OF DRAWINGS

FIGS. 1A and 1B illustrate a completed silicon wafer, a cover plate and an epoxy layer.

FIGS. 2A and 2B illustrate the wafer, cover plate and epoxy layer of FIGS. 1A and 1B with scribing along a back surface of the wafer.

FIG. 7 illustrates a method of making the integrated circuit devices of FIGS. 1–6.

Like reference symbols in the various drawings may indicate like elements.

DETAILED DESCRIPTION

Figure 1A:
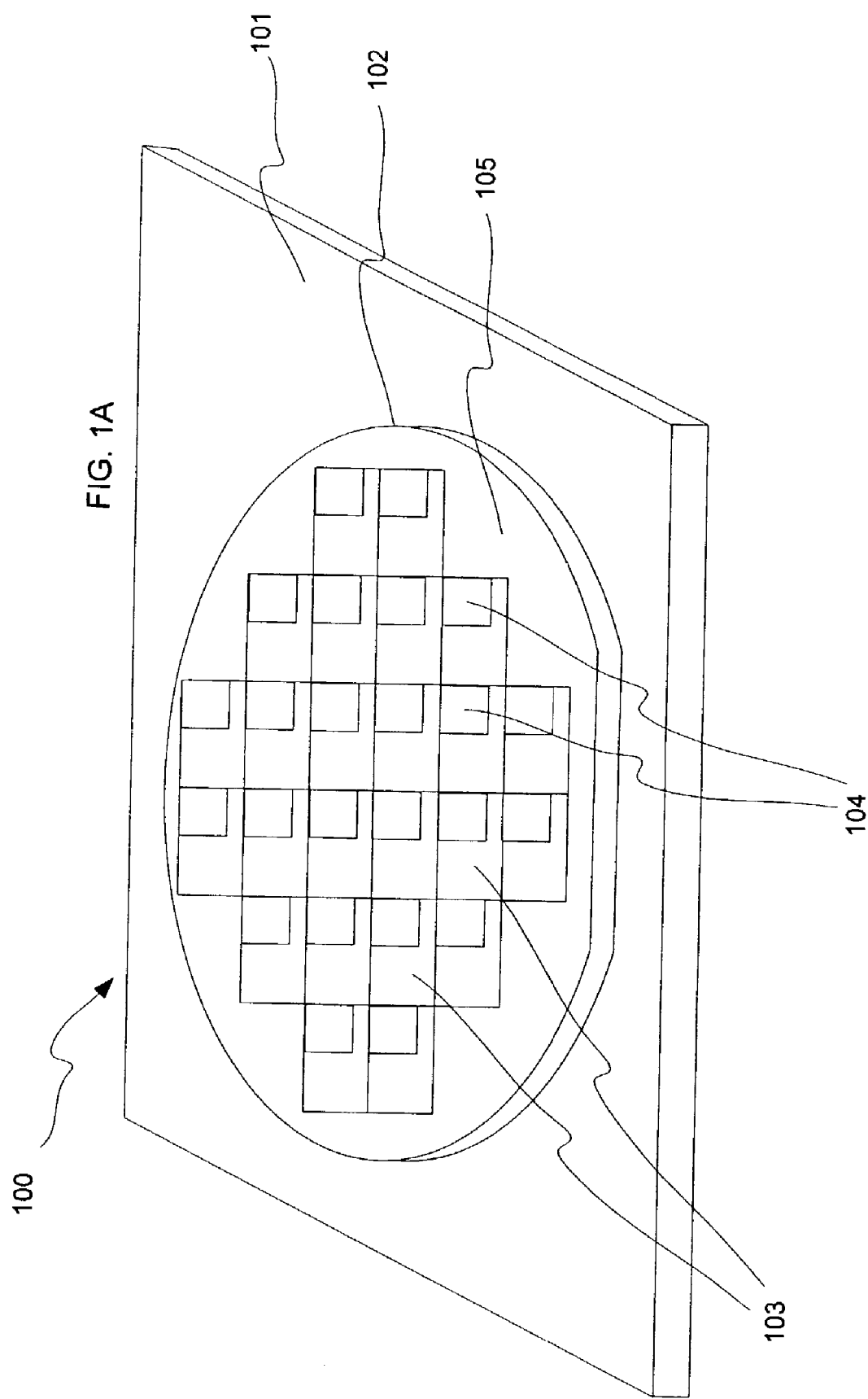

FIGS. 1–6 illustrate a method of fabricating a multi-segment chip or an integrated circuit device. FIGS. 1A and 1B illustrate a completed wafer/substrate 102, a field oxide layer 110, an insulating cover plate 101 (also called insulating layer, insulating packaging layer or protective material) and an epoxy layer 106. The wafer 102 may be made of silicon and/or other suitable materials. The wafer 102 has a plurality of finished dies 103 (with integrated circuits) formed by techniques known to those of ordinary skill in the art. Each finished die 103 may include one or more sub-dies 104, which may also be referred to as silicon-islands, integrated circuit blocks or segments.

The sub-dies 104 may be digital, analog, mixed signal, high voltage, low voltage, high current, low current, high power, low power, high frequency, low frequency, low noise (or low noise immunity), high noise, output driver, line driver or have any other desired electrical, physical or functional characteristics. The sub-dies 104 may have integrated circuits with different operating voltage ranges, such as 0V to +3V, −3V to 0V, 0V to 5V, −5V to 0V, 0V to 10V, −10V to 0V, 0V to 20V, −20V to 0V and so on. For example, a first sub-die 104 may have an integrated circuit with an operating voltage range of 0 to 3V. A second sub-die 104 may have an integrated circuit with an operating voltage range of 0 to 5V.

One sub-die 104 may have a higher operating voltage characteristic than another sub-die 104. For example, a first sub-die 104 may have an integrated circuit with an operating voltage range of 0 to 3V. A second sub-die 104 may have an integrated circuit with an operating voltage range of 12 to 15V. The range (3 volts) is the same, but the integrated circuit of the second sub-die 104 has a higher operating voltage offset than the integrated circuit of the first sub-die 104. A sub-die 104 may include an output driver.

Metal connects or pads 108 (also called pad extension layers) may be formed on top of the substrate 102 fully or at least partially overlaying two integrated circuit dies 103. Other metal connects 107 may be formed, where each connect 107 is formed on top of the substrate 102 at least partially overlaying and interconnecting two sub-dies 104 on a die 103. Although one connect 107 is shown between two particular sub-dies 104, there may be any number of connects 107 of any shape or size between two particular sub-dies 104. Similarly, although one connect 108 is shown between two particular dies 103, there may be any number of connects 108 of any shape or size between two particular dies 103. The metal connects 108 may connect to various gates, source drains, junctions and other components (e.g., resistors, capacitors) within die 103 by way of holes (also called vias or contacts) which are created (e.g., etched or milled) prior to deposition of the metal layer. Similarly, the metal connects 107 may connect to various gates, source drains, junctions and other components (e.g., resistors, capacitors) within sub-dies 104 by way of holes (also called vias or contacts) which are created (e.g., etched or milled) prior to deposition of the metal layer.

The field oxide layer 110 may also be called a "passivation" layer. The field oxide layer 110 may be between a metal layer (which is etched to form the metal connects 107, 108) and the substrate 104. The field oxide layer 110 may be very thin with respect to other layers in FIG. 1B. Some techniques form a second oxide layer or "passivation" layer (not shown) on top of the metal connects 107, 108 (independent of the first field oxide layer 110). Thus, an application specific integrated circuit (ASIC) may have a ground plane (not shown), a first oxide layer 110 to separate the metal layer from the substrate, and a second oxide (passivation) layer on top of the metal connects 107, 108 somewhere.

Figure 1B:
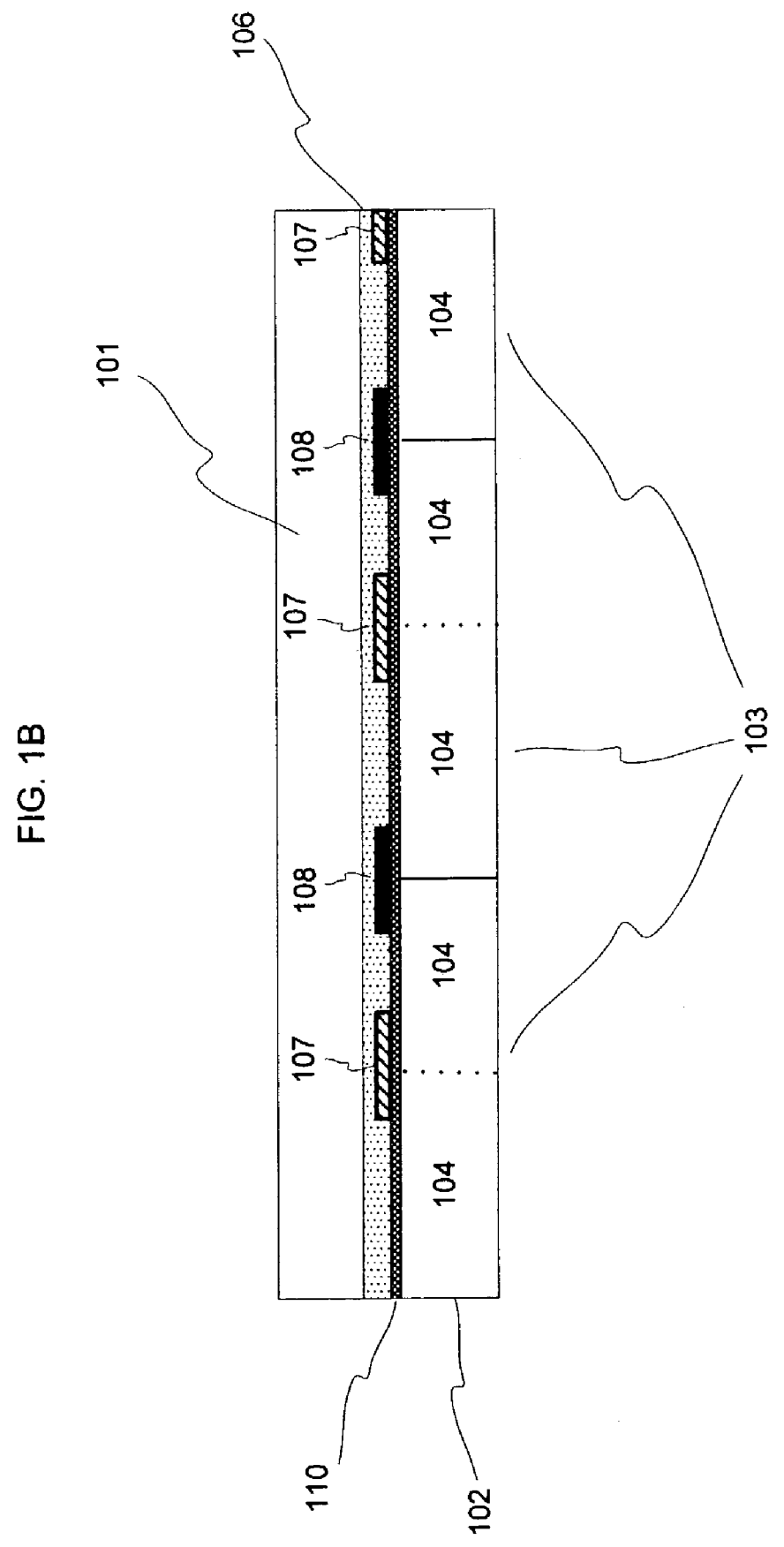

The completed wafer 102 may have an active surface 105, which may be bonded to a transparent insulating cover plate 101 via a layer of epoxy 106. The epoxy layer 106 may be non-conductive. As shown in FIGS. 1A and 1B, the wafer 102 is underneath the transparent cover plate 101. The insulating cover plate 101 may comprise glass, aluminum, beryllium, sapphire or other suitable insulating substrate. The cover plate 101 may be transparent to radiation in a spectral region useful for optical or infrared alignment.

Certain acts in a conventional process to fabricate a wafer may be eliminated when a wafer is made in accordance with methods described herein. These acts may include the provision of via openings above pads, wafer back grinding and wafer back metal coating.

The completed wafer 102 may be formed with an integral ground plane (not shown) by conventional lithography techniques at any suitable location therein. Alternatively, prior to bonding the wafer 102 to the cover plate 101 of FIGS. 1A & 1B, a ground plane (not shown) may be deposited and configured by conventional techniques over the active surface 105, such that the ground plane lies between the active surface 105 and the epoxy layer 106.

After the bonding act described above, the wafer 102 is optionally ground down or otherwise reduced to a decreased thickness, such as 200 microns. This reduction in wafer thickness may be enabled by the additional mechanical strength provided by bonding the insulating cover plate 101 to the wafer 102. A grinding apparatus may be used, such as Model 32BTGW using 12.5A abrasive, which is commercially available from Speedfam Machines Co. Ltd. of England.

FIGS. 2A and 2B illustrate the wafer 102, cover plate 101 and epoxy layer 106 of FIGS. 1A and 1B with scribing along a back surface of the wafer 102. After reducing the thickness of the wafer 102, which is optional, the wafer 102 may be scribed along its back surface along (a) predetermined dice-lines 201 (or boundaries), which separate the dies 103, to form scribed channels 203, and (b) predetermined isolation-lines 202 (or boundaries), which separate the sub-dies 104 from each other within an individual die 103, to form isolation channels 204. The scribed channels 203 and isolation channels 204 may be of sufficient depth to reduce the wafer thickness to about 100 microns, for example. A scribing apparatus may be used, such as a Kulicke & Soffa 775 dicing saw employing an Ni plated diamond loaded blade.

Some examples of grinding, scribing, etching and notching may be described in U.S. Pat. Nos. 6,040,235, 6,117,707, 5,455,455 and 5,547,906.

Figure 3:
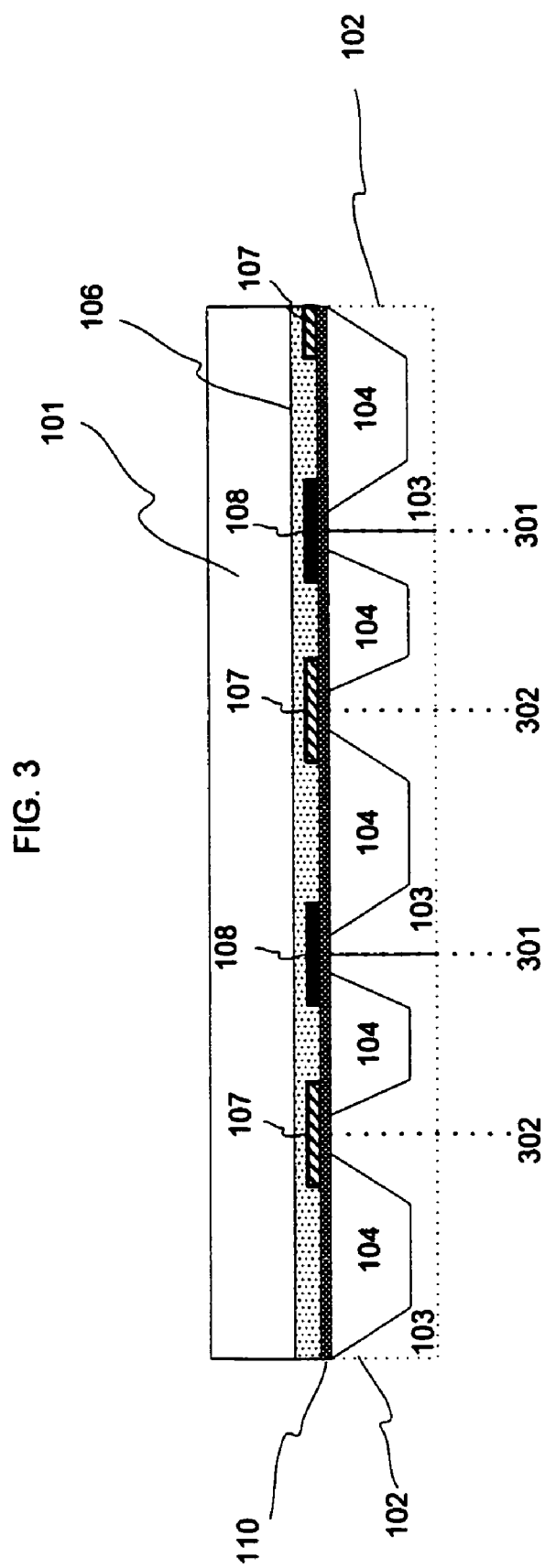
FIG. 3 illustrates the wafer, cover plate and epoxy layer of FIGS. 2A and 2B with etching along a back surface of the wafer.

FIG. 3 illustrates the wafer 102, cover plate 101 and epoxy layer 106 of FIGS. 2A and 2B with etching along a back surface of the wafer 102. The scribed wafer 102 may be etched in a conventional silicon etching solution, such as a combination of 2.5% hydrofluoric acid, 50% nitric acid, 10% acetic acid and 37.5% water, so as to etch the silicon up to the field oxide layer 110. It is preferred that the etching in FIG. 3 does not expose the connects 107 between sub-dies 104. The etching in FIG. 3 may or may not etch through the field oxide layer 110 to expose the connects 108 between dies 103. Further etching in FIG. 5 may expose the connects 108 between dies 103. The etching may form notches or trenches 301, 302 as shown in FIG. 3. The etching may use a chemical etch process, laser etching, reactive ion etching (RIE), deep reactive ion etching (DRIE) or other techniques, such as ion milling. The etching may occur in a temperature-controlled bath containing a silicon etch solution. Commercially available equipment for this purpose may include a Chemkleen bath and an WHRV circulator both of which are manufactured by Wafab Inc. of the U.S.A. A suitable conventional silicon etching solution is Isoform Silicon etch, which is commercially available from Micro-Image Technology Ltd. of England. The wafer may be rinsed after etching.

The silicon etching results in a plurality of separated dies 103 via dicing-trenches 301, and a plurality of separated sub-dies 104 within each die 103 via isolation-trenches 302. Each die 103 and sub-die 104 may include silicon with a thickness of about 100 microns, for example, which is reduced from the thickness of about 200 microns in FIG. 2B. Any desired thickness may be implemented.

Figure 4:
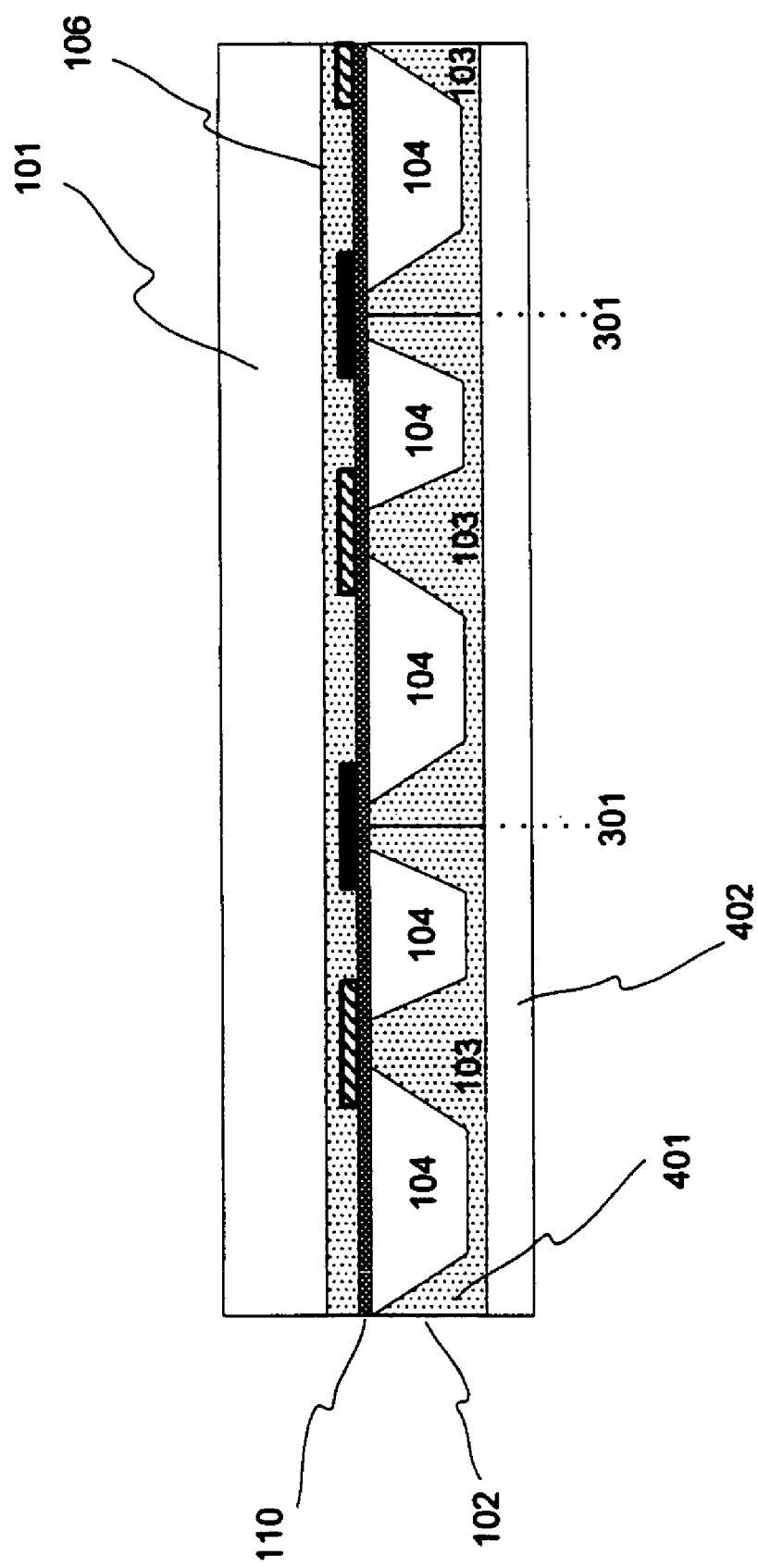
FIG. 4 shows a second layer of epoxy filling the interstices between dies and sub-dies in FIG. 3 and between the sub-dies and a second insulating packaging layer.

After the silicon etching, FIG. 4 shows a second layer 401 of epoxy filling the interstices between dies 103 and sub-dies 104 in FIG. 3 and between the sub-dies 104 and a second insulating packaging layer 402. The epoxy layer 401 may be non-conductive. The epoxy 401 may be formed between the dies 103, the sub-dies 104 and a second insulating packaging layer 402, which is bonded over the dies 103 and sub-dies 104 on a side opposite to the first insulating packaging layer or cover plate 101. The second insulating packaging layer 402 may comprise glass, aluminum, beryllium, sapphire or other suitable insulating substrate.

A feature of the present application may involve etching the silicon 102 along the isolation-channels 204 (FIG. 2B), creating the isolation-trenches 302 (FIG. 3), filling the isolation-trenches 302 with insulating epoxy 401 (FIG. 4.), and providing a desired separation between electronic circuits (on sub-dies) with different characteristics on the same die 103.

Figure 5:
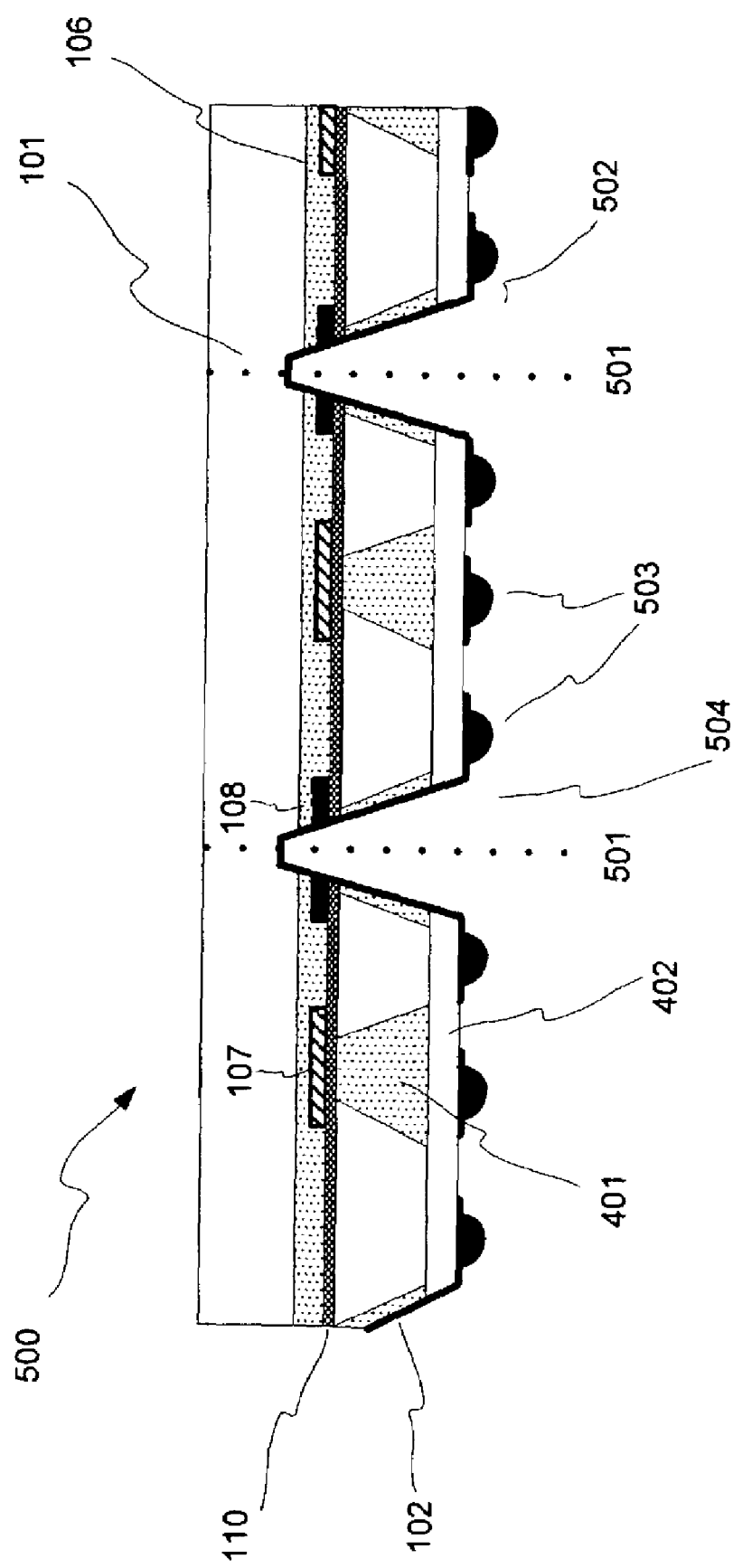
FIG. 5 illustrates a sandwich of the etched wafer between the first and second insulating packaging layers being partially cut along lines that lie along interstices between adjacent dies.

FIG. 5 illustrates a sandwich 500 of the etched wafer 102 between the first and second insulating packaging layers 101, 402 being partially cut along lines 501 that lie along interstices between adjacent dies 103. The partial cutting defines trenches 504 along the outlines of a plurality of pre-packaged integrated circuits. The trenches 504 produced by partial cutting in FIG. 5 may form inclined sidewalls or non-inclined sidewalls.

The partial cutting of the sandwich 500 in FIG. 5 along lines 501 exposes edges of the connects/pads 108 on the wafer 102. The edges of the connects/pads 108, when so exposed, may define contact surfaces for the dies 103. FIG. 5 depicts the formation of metal contacts 502 along the inclined edges of the trench 504 to establish electrical contact with exposed surfaces of the connects/pads 108. The contacts 502 extend to contacts 503 on a part of the surface of the second insulating packaging layer 402. The contacts 502, 503 may be formed by any suitable metal deposition technique or other technique. The contacts 502 may be formed onto the dies 103 in electrical contact with surfaces of the connects/pads 108 without first separating the dies 103 into individual chips. The contacts 502, 503 may comprise external leads, a solder mask layer and solder bumps.

Partial cutting of the sandwich of FIG. 5 may also expose edge portions of a ground plane (not shown), which define ground plane contact surfaces (not shown).

Figure 6:
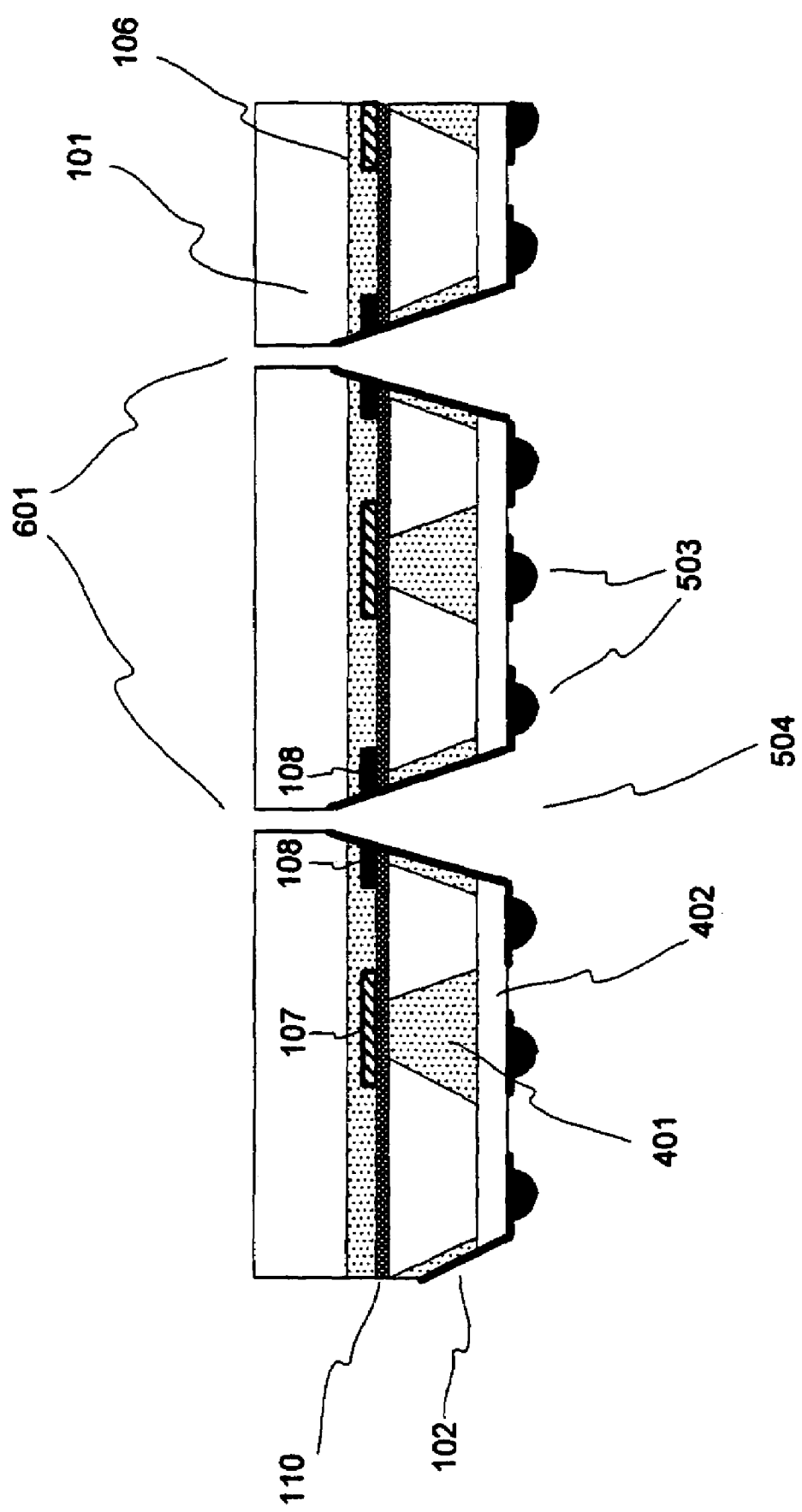
FIG. 6 illustrates dicing the individual dies on the wafer via straight cuts to form individual pre-packaged integrated circuit devices.

After forming the metal contacts 502, 503, FIG. 6 illustrates dicing or cutting the individual dies 103 on the wafer 102 via straight cuts 601 to form a plurality of individual pre-packaged integrated circuit devices. Three pre-packaged integrated circuit devices are shown in FIG. 6, but the process may provide any number of pre-packaged integrated circuit devices.

In alternative embodiment, a trench 504 may not expose the connects/pads 108, and metal contacts 502 are not formed prior to dicing. Rather, a trench 504 is formed, then a subsequent manufacturing step (dicing) forms the straight cut 601 at the center of the trench 504 (FIG. 6), which exposes edges of connects/pads 108. Then metal contacts are formed along the inclined edges of the trench 504, along a part of the surface of the second insulating packaging layer 402, and along a part of perpendicular side walls of the cut 601, which may extend perpendicularly to a top surface of the first insulating layer 402. These contacts may be formed by any suitable metal deposition technique. These contacts may extend inside trench 504 and inside straight cut 601, which establishes electrical contact with edge surfaces of connects/pads 108. In this embodiment, the metal contacts are formed onto the dies in electrical contact with surfaces of connects/pads 108 after separating the dies into individual chips.

FIG. 7 illustrates a method of making the integrated circuit devices of FIGS. 1–6.

The methods described above may produce a device comprising a combination of different circuits in a system-on-a-chip configuration.

A number of aspects have been described. Nevertheless, it will be understood that various modifications may be made. For example, the sidewalls of the sub-dies 104 in FIG. 3 and the walls of the packaged devices in FIG. 6 may or may not be inclined. Accordingly, other aspects are within the scope of the following claims.

What is claimed is:

1. An integrated circuit device comprising:
   a first die formed on a substrate, the first die comprising:
      a first sub-die having a first integrated circuit; and
      a second sub-die having a second integrated circuit, the first integrated circuit being isolated from the second integrated circuit;
   a connect in contact with the first and second sub-dies;
   a first protective layer and a first epoxy layer proximate to a first surface of the first and second sub-dies; and
   a second protective layer proximate to a second surface of the first and second sub-dies.

2. The device of claim 1, wherein the first and second sub-dies have substantially no substrate coupling.

3. The device of claim 1, wherein the first integrated circuit comprises an analog circuit, and the second integrated circuit comprises a digital circuit.

4. The device of claim 3, further comprising a third sub-die having a mixed signal integrated circuit.

5. The device of claim 1, wherein the first integrated circuit comprises an analog circuit, and the second integrated circuit comprises a mixed signal circuit.

6. The device of claim 1, wherein the first integrated circuit has a higher operating voltage than the second integrated circuit.

7. The device of claim 1, wherein the first integrated circuit has a different operating voltage range than the second integrated circuit.

8. The device of claim 1, wherein the first integrated circuit has a higher operating current than the second integrated circuit.

9. The device of claim 1, wherein the first integrated circuit has a higher operating power than the second integrated circuit.

10. The device of claim 1, wherein the first integrated circuit has a higher noise level than the second integrated circuit.

11. The device of claim 1, wherein the first integrated circuit has a higher noise immunity level than the second integrated circuit.

12. The device of claim 1, wherein at least one integrated circuit comprises an output driver circuit.

13. The device of claim 1, wherein at least one integrated circuit comprises a line driver circuit.

14. The device of claim 1, comprising a combination of different circuits in a system-on-a-chip configuration.

15. The device of claim 1, further comprising a third sub-die having a third integrated circuit, the third integrated circuit being isolated from the first and second integrated circuits.

16. The device of claim 1, wherein the connect overlies the first and second sub-die.

17. The device of claim 1, further comprising a second die formed on the substrate, the second die comprising a third sub-die having a third integrated circuit, the third integrated circuit being isolated from the first and second integrated circuit.

18. The device of claim 17, further comprising a second connect electrically connecting the first and second dies.

19. The device of claim 18, wherein the second connect overlies the first and second dies.

20. The device of claim 1, wherein the device is a multi-segment chip.

21. The device of claim 1, further comprising an insulating layer between the first and second sub-dies.

22. The device of claim 1, wherein further comprising an epoxy layer between the first and second sub-dies.

23. The device of claim 17, further comprising a dividing groove separating the first die from the second die.

24. The device of claim 17, further comprising a conductive layer on opposing sides of the first die from the second die.

25. An integrated circuit device comprising:
a first die formed on a substrate, the die comprising:
a first sub-die having a first integrated circuit; and
a second sub-die having a second integrated circuit, the first integrated circuit being isolated from the second integrated circuit; and
a first conductor electrically connecting the first and second sub-dies.

26. The device of claim 25, further comprising a second die formed on the substrate, the second die comprising a third sub-die having a third integrated circuit.

27. The device of claim 26, further comprising a second conductor electrically connecting the first die and the second die.

28. The device of claim 27, further comprising an insulator layer between the first die and the first conductor.

29. The device of claim 25, further comprising an insulator layer between the first and second dies and the first and second conductors.

30. The device of claim 25, further comprising an epoxy over the first conductor.

31. The device of claim 25, further comprising a transparent cover over the first conductor.

32. The device of claim 25, further comprising a dividing groove separating the first die from the second die.

33. The device of claim 25, further comprising a conductive on opposing sides of the first die from the second die.

34. The device of claim 25, further comprising an insulating layer between the first and second sub-dies.

35. The device of claim 25, further comprising an epoxy layer between the first and second sub-dies.

* * * * *